United States Patent
Bautista, Jr. et al.

(10) Patent No.: US 6,331,951 B1
(45) Date of Patent: Dec. 18, 2001

(54) METHOD AND SYSTEM FOR EMBEDDED CHIP ERASE VERIFICATION

(75) Inventors: Edward V. Bautista, Jr., Santa Clara; Darlene G. Hamilton, San Jose, both of CA (US); Weng Fook Lee, Penang (MY); Pau-Ling Chen, Saratoga; Keith H. Wong, San Jose, both of CA (US)

(73) Assignee: Advanced Micro Devices, Inc., Sunnyvale, CA (US)

( * ) Notice: Subject to any disclaimer, the term of this patent is extended or adjusted under 35 U.S.C. 154(b) by 0 days.

(21) Appl. No.: 09/717,550

(22) Filed: Nov. 21, 2000

(51) Int. Cl.[7] .................................................. G11C 16/06
(52) U.S. Cl. .............................. 365/185.22; 365/185.03; 365/185.29
(58) Field of Search ..................... 365/185.03, 185.22, 365/185.29, 185.33

(56) References Cited

U.S. PATENT DOCUMENTS

| | | | |
|---|---|---|---|
| 5,163,021 | * 11/1992 | Mehrotra et al. | 365/185.03 |
| 5,768,191 | * 6/1998 | Choi et al. | 365/185.22 |
| 5,862,074 | * 1/1999 | Park | 365/185.03 |
| 5,928,370 | 7/1999 | Asnaashari | 714/48 |
| 5,940,323 | 8/1999 | Kwon | 365/185.22 |
| 5,991,206 | 11/1999 | Shin | 365/185.29 |
| 6,028,792 | * 2/2000 | Tanaka et al. | 365/185.22 |
| 6,038,175 | 3/2000 | Ra | 365/185.29 |

* cited by examiner

Primary Examiner—Son Mai
(74) Attorney, Agent, or Firm—Eschweiler & Associates, LLC

(57) ABSTRACT

A method and system are disclosed for verifying memory cell erasure, which may be employed in association with a dual bit memory cell architecture. The method includes selectively verifying proper erasure of one of a first bit of the cell and a second bit of the cell, determining that the dual bit memory cell is properly erased if the first and second bits of the cell are properly erased, and selectively erasing at least one of the first and second bits of the cell if one of the first and second bits is not properly erased. The method may also comprise selectively re-verifying proper erasure of one of the first and second bits after selectively erasing at least one of the first and second bits.

23 Claims, 9 Drawing Sheets

METHOD AND SYSTEM FOR EMBEDDED CHIP ERASE VERIFICATION

FIELD OF INVENTION

The present invention relates generally to memory systems and in particular to systems and methods for verifying erasure of sectors of bits in electronic memory devices.

BACKGROUND OF THE INVENTION

Flash memory is a type of electronic memory media which can be rewritten and hold its content without power. Flash memory devices generally have life spans from 100K to 300K write cycles. Unlike dynamic random access memory (DRAM) and static random access memory (SRAM) memory chips, in which a single byte can be erased, flash memory is typically erased and written in fixed multi-bit blocks or sectors. Evolving out of electrically erasable read only memory (EEPROM) chip technology, which can be erased in lace, flash memory is less expensive and more dense. This new category of EEPROMs has emerged as an important non-volatile memory which combines the advantages of EPROM density with EEPROM electrical erasability.

Conventional flash memories are constructed in a cell structure wherein a single bit of information is stored in each cell. In such single bit memory architectures, each cell typically includes a metal oxide semiconductor (MOS) transistor structure having a source, a drain, and a channel in a substrate or P-well, as well as a stacked gate structure overlying the channel. The stacked gate may further include a thin gate dielectric layer (sometimes referred to as a tunnel oxide) formed on the surface of the P-well. The stacked gate also includes a polysilicon floating gate overlying the tunnel oxide and an interpoly dielectric layer overlying the floating gate. The interpoly dielectric layer is often a multilayer insulator such as an oxide-nitride-oxide (ONO) layer having two oxide layers sandwiching a nitride layer. Lastly, a polysilicon control gate overlies the interpoly dielectric layer.

The control gate is connected to a word line associated with a row of such cells to form sectors of such cells in a typical NOR configuration. In addition, the drain regions of the cells are connected together by a conductive bit line. The channel of the cell conducts current between the source and the drain in accordance with an electric field developed in the channel by the stacked gate structure. In the NOR configuration, each drain terminal of the transistors within a single column is connected to the same bit line. In addition, each flash cell has its stacked gate terminal coupled to a different word line, while all the flash cells in the array have their source terminals coupled to a common source terminal. In operation, individual flash cells are addressed via the respective bit line and word line using peripheral decoder and control circuitry for programming (writing), reading or erasing functions.

Such a single bit stacked gate flash memory cell is programmed by applying a relatively high voltage to the control gate and connecting the source to ground and the drain to a predetermined potential above the source. A resulting high electric field across the tunnel oxide leads to a phenomena called "Fowler-Nordheim" tunneling. During this process, electrons in the core cell channel region tunnel through the gate oxide into the floating gate and become trapped in the floating gate since the floating gate is surrounded by the interpoly dielectric and the tunnel oxide. As a result of the trapped electrons, the threshold voltage of the cell increases. This change in the threshold voltage (and thereby the channel conductance) of the cell created by the trapped electrons is what causes the cell to be programmed.

In order to erase a typical single bit stacked gate flash memory cell, a relatively high voltage is applied to the source, and the control gate is held at a negative potential, while the drain is allowed to float. Under these conditions, a strong electric field is developed across the tunnel oxide between the floating gate and the source. The electrons that are trapped in the floating gate flow toward and cluster at the portion of the floating gate overlying the source region and are extracted from the floating gate and into the source region by way of Fowler-Nordheim tunneling through the tunnel oxide. As the electrons are removed from the floating gate, the cell is erased.

In conventional single bit flash memory devices, an erase verification is performed to determine whether each cell in a block or set of such cells has been properly erased. Current single bit erase verification methodologies provide for verification of bit or cell erasure, and application of supplemental erase pulses to individual cells which fail the initial verification. Thereafter, the erased status of the cell is again verified, and the process continues until the cell or bit is successfully erased or the cell is marked as unusable.

Recently, dual bit flash memory cells have been introduced, which allow the storage of two bits of information in a single memory cell. The conventional erase verification methods employed with single bit stacked gate architectures may be applied in certain circumstances to such dual bit devices. However, there is a need for new and improved erase verification methods and systems, which ensure proper erasure of data bits in a dual bit memory architecture, and which account for the structural characteristics thereof

SUMMARY OF THE INVENTION

A system and methodology are provided which overcome or minimize the problems and shortcomings of conventional memory cell erasure verification schemes and systems. The invention includes methods and systems for verifying erasure of one or more dual bit cells in a memory device, such as a flash memory. The invention allows for efficient and thorough erasure verification, which minimizes data retention and over-erase issues particular to the dual bit cell architecture. The invention provides significant advantages when employed in association with dual bit memory cells wherein only one bit thereof is actively used for data storage. However, it will be recognized that the invention finds utility in association with dual bit memory cell architectures generally, and that the invention is thus not limited to any particular dual bit cell usage implementation or configuration.

In accordance with one aspect of the invention, there is provided a method of verifying erasure of a dual bit memory cell, which includes a first bit and a second bit. The erasure verification method comprises the steps of performing a determination of whether a first bit in the dual bit memory cell is properly erased, performing a first verification of whether a second bit in the dual bit memory cell is properly erased if the first bit is properly erased, and determining that the dual bit memory cell is properly erased if the first bit is properly erased and if the second bit is properly erased according to the first verification.

Verification of proper erasure of both bits in a dual bit memory cell configuration according to the inventive method ensures that data retention and/or bit over-erase problems associated with one of the bits in the cell do not adversely affect the operation (e.g., proper erasure, read/write functionality) of the other bit. In this manner, the invention provides significant performance advantages over conventional methods typically utilized in erasure of single bit (e.g., stacked gate) memory cell types. The method may further comprise repeating the method for another dual bit memory cell, whereby a cell by cell erasure verification may be accomplished, for example, in association with a chip erase or sector erase operation. The verifications of bit erasure may be performed through the application of a voltage to the memory cell being verified along with a measurement of a current in the cell.

In addition to the above, the method may also include erasing the first bit if the first bit is not properly erased, and performing a second verification of whether the second bit is properly erased after erasing the first bit, where erasing the first bit comprises applying a voltage to the cell. In this fashion, the method attempts to re-erase individual cell bits which were previously not properly erased (e.g., via an initial erase operation applied to a block or sector of such memory cells prior to cell by cell erasure verification according to the invention). Thus, a bit in a cell may be rendered useable again via the attempt to re-erase such a cell, even though the first or previous attempts were unsatisfactory.

The method may include several such selective re-erasures, as well as selective erasure re-verifications. For instance, the method may include repeating the determination of whether the first bit in the dual bit memory cell is properly erased if the second bit is properly erased according to the second verification, repeating the first verification of whether the second bit in the dual bit memory cell is properly erased if the first bit is properly erased, and determining that the dual bit memory cell is properly erased if the first bit is properly erased and if the second bit is properly erased according to the repeated first verification. In addition, the second bit may be erased if not previously erased properly according to the second erasure verification, after which the determination of whether the first bit is properly erased may be repeated if the second bit is properly erased according to the second verification. Moreover, the first verification of whether the second bit is properly erased may then be repeated if the first bit is properly erased. The method thus proceeds to selectively re-erase and re-verify proper erasure of one or both of the bits, until both such bits are successively verified as properly erased, or until a maximum number of such attempts have been tried to no avail.

According to another aspect of the invention, there is provided a method for erasing a plurality of dual bit flash memory cells, which includes the steps of erasing the plurality of dual bit flash memory cells, verifying proper erasure of a first bit in at least one of the plurality of dual bit flash memory cells, verifying proper erasure of a second bit in the at least one of the plurality of dual bit flash memory cells, and determining that the cell is properly erased if the first and second bits are properly erased. The method may further comprise selectively erasing at least one of the first and second bits if one of the first and second bits is not properly erased, as well as selectively re-verifying proper erasure of at least one of the first and second bits.

In addition, the method may also include the steps of erasing the first bit if the first bit was not properly erased, re-verifying proper erasure of the second bit after erasing the first bit, re-verifying proper erasure of the first bit after re-verifying proper erasure of the second bit if the second bit is properly erased, again re-verifying proper erasure of the second bit after re-verifying proper erasure of the first bit if the first bit is properly erased, and determining that the at least one of the plurality of dual bit memory cells is properly erased if the first and second bits are properly erased.

According to yet another aspect of the invention, there is provided a method of verifying erasure of a dual bit memory cell, comprising selectively verifying proper erasure of one of a first bit of the cell and a second bit of the cell, determining that the dual bit memory cell is properly erased if the first and second bits of the cell are properly erased, and selectively erasing at least one of the first and second bits of the cell if one of the first and second bits is not properly erased. The method may also comprise selectively re-verifying proper erasure of one of the first and second bits after selectively erasing at least one of the first and second bits.

According to still another aspect of the invention, a system is provided for verifying proper erasure of a dual bit memory cell. The system comprises means for selectively verifying proper erasure of one of a first bit of the cell and a second bit of the cell, means for determining that the dual bit memory cell is properly erased if the first and second bits of the cell are properly erased, and means for selectively erasing at least one of the first and second bits of the cell if one of the first and second bits is not properly erased.

To the accomplishment of the foregoing and related ends, the invention comprises the features hereinafter fully described and particularly pointed out in the claims. The following description and the annexed drawings set forth in detail certain illustrative aspects and implementations of the invention. These are indicative, however, of but a few of the various ways in which the principles of the invention may be employed. Other objects, advantages and novel features of the invention will become apparent from the following detailed description of the invention when considered in conjunction with the drawings.

DETAILED DESCRIPTION OF THE INVENTION

Figure 1:
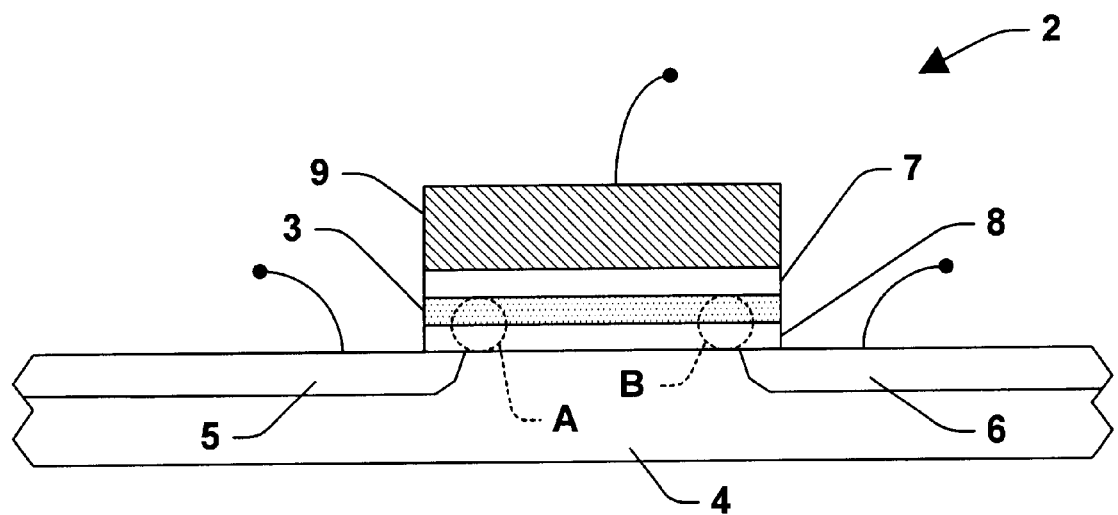
FIG. 1 is a schematic side elevation view in section of an exemplary dual bit memory cell in which various aspects of the present invention may be implemented.

The following is a detailed description of the present invention made in conjunction with the attached figures, wherein like reference numerals will refer to like elements throughout. The invention provides methodologies and a system for verifying proper erasure of one or more dual bit memory cells, and may be used in conjunction with a chip erase or sector erase operation in a flash memory device. For example, a sector erase or preprogramming operation may be performed in order to apply erase pulses to each such cell in a flash memory device. Thereafter, the invention may be employed in order to verify which cells in the device have been properly erased.

In addition, the invention selectively attempts to re-erase cells (e.g., via selective application of erase voltage pulses to one or both individual bits in a dual bit memory cell) which have not been properly erased in the preprogramming operation. The invention also provides for selective re-verification of proper erasure of one or both bits in a dual bit cell. Although the invention is hereinafter illustrated and described in association with a dual bit memory cell architecture wherein only one bit of each cell is used for data storage, it will be appreciated that the invention is applicable to other type architectures and other dual bit architecture usage schemes.

Referring now to the drawings, FIG. 1 illustrates an exemplary dual bit memory cell 2 in which one or more of the various aspects of the invention may be carried out. The memory cell 2 comprises a silicon dioxide layer 3 with buried polysilicon islands (not numerically designated) therein. A P-type substrate 4 has buried N+ source 5 and N+ drain 6 regions. The silicon dioxide 3 is sandwiched between two layers of silicon dioxide 7, and 8. Alternatively, the layer 3 may comprise a silicon nitride or any other form of charge trapping layer.

Overlying the oxide layer 7 is a polysilicon gate 216. This gate 9 is doped with an N-type impurity (e-g, phosphorus). The memory cell 2 is capable of storing two data bits, a left bit represented by the dashed circle A and a right bit represented by the dashed circle B. The dual bit memory cell 2 is generally symmetrical, thus the drain 6 and the source 5 are interchangeable. Thus, the left junction 5 may serve as the source terminal and the right junction 6 as the drain terminal with respect to the right bit B. Likewise, the right junction 6 may serve as the source terminal and the left junction 5 as the drain terminal for the left bit A.

Various implementations of dual bit memory cell architecture may be verified according to one or more aspects of the present invention. In particular, the invention is applicable to memory devices wherein both bits in the dual bit cells (e.g., bits A and B of cell 2) are used for data or information storage, as well as those in which only one bit (e.g., bit A of cell 2) of the dual bit cell is so used. The inventors of the present invention have found that even where one bit in such a cell is not used for data storage (e.g., bit B of cell 2), that programming and/or erasure of the data storage bit (e.g., bit A) may cause various physical phenomena to occur in the unused bit (e.g., bit B).

For example, repeated programming of bit A of cell 2 may cause data retention in bit B and vice versa. Also, repeated application of erase voltage pulses to bit A may cause over erasure of bit B. These phenomena in the unused bit B may in turn cause degradation with respect to the operation of the bit used for data storage (e.g., the ability to effectively read, write/program, and/or erase bit A). The invention addresses these problems with respect to dual bit memory cell technology by selectively verifying, erasing, and re-verifying the individual bits of such memory cells in order to further ensure the proper erasure of the memory cell, for example, in a block or sector erase operation in a flash memory device.

Figure 2:
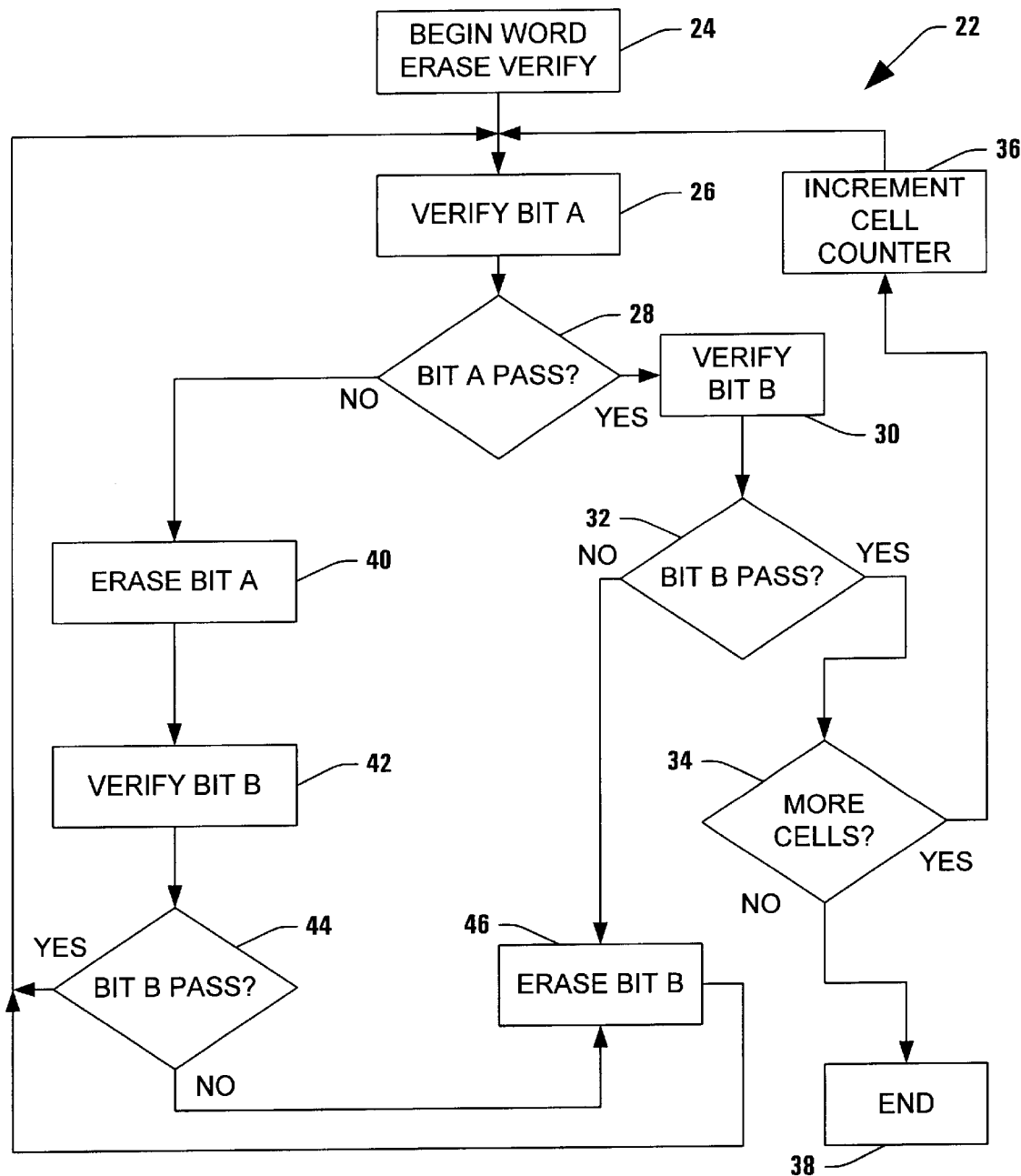
FIG. 2 is a flow diagram illustrating an exemplary method for verifying memory cell erasure in accordance with an aspect of the invention.

Referring now to FIG. 2, an exemplary method 22 is illustrated for memory erasure, which may be advantageously employed in association with one or more dual bit flash memory cells (e.g., cell 2 of FIG. 1), for example, as part of a sector erase operation. For example, once a pre-programming operation has been performed to erase the data bits of a sector of memory (e.g., by writing a 1 value thereto), the method 22 begins at step 24, after which the first or "A" bit of a dual bit memory cell (e.g., bit A of cell 2) is verified at step 26. At decision step 28, a determination is made as to whether bit A has been properly erased. As illustrated and described in greater detail hereinafter with respect to FIG. 6, the erasure verification operations performed at steps 26, 30, and 42, of the method 22, may be carried out via the application of a voltage to the cell and the sensing of a current in the cell. For example, where a properly erased bit in a memory cell has a lower threshold voltage than that of a programmed bit, an appropriate voltage between the programmed bit threshold voltage and that of an erased bit may be applied to two terminals of the three terminal memory structure (e.g., dual bit memory cell 2 of FIG. 1), and the resulting current may be sensed to determine whether the bit has been properly erased.

If bit A has been properly erased at step 28, the method 22 proceeds to step 30, whereat a verification is performed to verify proper erasure of a second bit "B" in the dual bit architecture memory cell. Only one bit (e.g., bit "A") in the dual bit memory cell is used for data storage in the following discussion. However, it will be appreciated that the method may be advantageously employed in association with dual bit memory cells wherein both bits are used for data storage. In addition, it will be appreciated that the selective verification of both bits in such a dual bit cell accounts for the possibility of data retention and over-erase conditions in one such bit affecting the operation of the other such bit, and accordingly provides for selective verification and re-erasure of such bits, in order to eliminate or minimize the cross effects of such phenomena.

Where it is found at decision step 32 that the second bit B has also been properly erased, the method proceeds to step 34, whereat it is determined whether more cells (e.g., in a multiple cell memory block or sector) need to be verified. For example, the method may be selectively employed to verify erasure of a certain number of the cells (e.g., eight or sixteen), which are connected in a NOR configuration, although other implementations are possible wherein any number of such cells may be serially verified according to the invention.

If there are other cells to be verified at decision step 34, the method proceeds to step 36, whereat a cell counter (not shown) may be incremented prior to returning to step 26. Otherwise (e.g., all such cells have been verified), the method ends at step 38. At this point it will be noted that the method 22 ensures against the deleterious cross effects of data retention and/or over-erasure of one bit in a dual bit memory cell with respect to the other such bit, by verifying the proper erasure of both bits in each cell prior to moving on to the next cell at step 36 or ending the process at step 38.

Referring again to step 28, if bit A in the cell has not been properly erased (e.g., as determined via the bit A verification at step 26), the method 22 proceeds to step 40 whereat bit A is erased (e.g., via the application of an erase pulse to two terminals of the cell as illustrated and described in greater detail hereinafter). At this point, the proper erasure of bit A could again be verified. However, the inventors of the present invention have found that deleterious consequences may result from the potential repeated erasure and verification of bit A. For instance, the repeated application of erase pulses to bit A may cause over-erasure of bit B. In order to ensure against such an over-erased condition in bit B, the method 22 verifies proper erasure of bit B at step 42 following application of an erase pulse to bit A at step 42.

In this manner, bit B will not be subjected to repeated erase pulses on bit A (and the residual effect thereof on bit B) without being itself verified after each application thereof to bit A. A decision is accordingly made at step 44 as to whether bit B (e.g., the second bit in the dual bit memory cell) has been properly erased. If so, the method 22 returns to step 26 for a re-verification of the proper erasure of bit A as described above. Otherwise (bit B is not properly erased), method 22 proceeds to step 46 whereat bit B is again erased (e.g., via application of an erase pulse to the cell) before returning to step 26. It will be noted in this regard, that following application of erase pulses to bit B at step 46, bit A is verified immediately thereafter at step 26. This methodology thus prevents repeated application of erase pulses to bit B (and the residual effect thereof on bit A) without bit A being verified after each application thereof to bit B. The method 22, thereby reduces the likelihood of over-erasure of the bits A and B caused during the erase verification.

Further in accordance with the method 22, if it is determined at step 32 that bit B has not been properly erased (e.g., as verified at step 30 following a determination at step 28 that bit A is properly erased), bit B is erased at step 46, after which the method 22 returns to step 26. Thus, the method 22 selectively verifies, re-verifies, erases, and re-erases one or both bits (e.g., bit "A" and bit "B") of a dual bit memory cell in order to ensure that both bits are properly erased (e.g., at step 32) prior to ending at step 38 or proceeding to another such cell at step 36.

It will be appreciated in this regard, that the method 22 may include internal counters or other steps by which a cell may be determined to be unuseable (e.g., unable to be properly erased) after a number of unsuccessful attempts at erasure/verification, whereby the cell (e.g., or a number of related cells, such as a byte or word) may be marked as bad, or the part itself may hang as part of a failed sector erase operation. Further in this regard, if the method 22 is employed in a manufacturing process (e.g., before or after packaging, but before shipment to a customer), redundancy may be employed to mark a cell or a number of cells as bad, and to provide alternate or redundant storage cells as a replacement, whereby acceptable manufacturing yield may be achieved. The method 22 may also be employed in association with a sector or chip erase operation initiated by an end-user, wherein a cell failure may be indicated to the user via the memory device hanging as a result.

Figure 3:
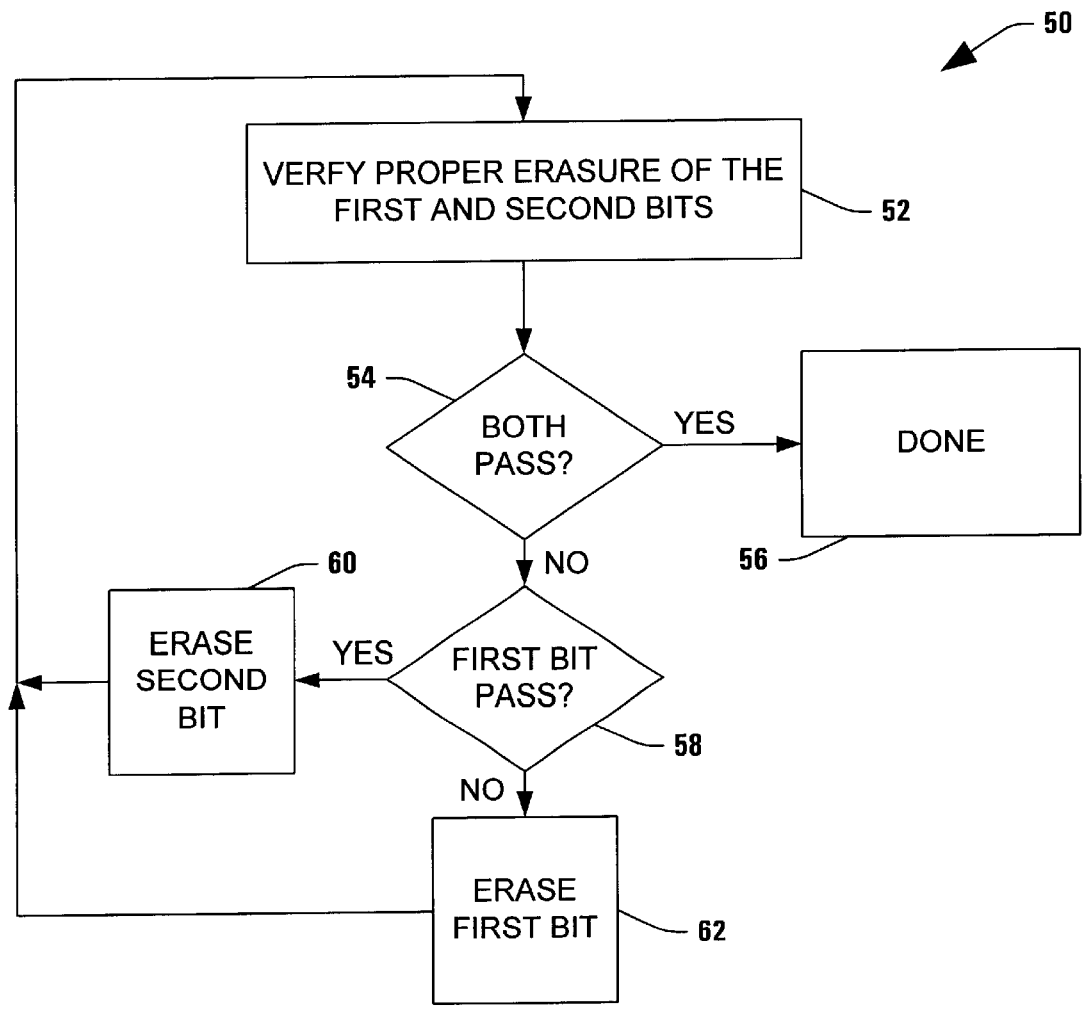
FIG. 3 is a flow diagram illustrating another exemplary method for verifying memory cell erasure according to the invention.

Referring now to FIG. 3, another exemplary method 50 is illustrated for verifying proper memory erasure in accordance with another aspect of the invention. Beginning at step 52, proper erasure of first and second bits of a dual bit memory cell are verified. If both bits (e.g., bit "A" and bit "B") are properly erased at decision step 54, the method is finished (e.g., with respect to one cell) at step 56. It will be appreciated at this point, that the method 50 may be included within a multiple cell erasure verification routine or method in which another memory cell may be verified following exit from the method 50 via step 56.

If one or both of the bits in a dual bit cell are not properly erased at step 54, a determination is made at decision step 58 as to whether the first bit is properly erased. If so, the method proceeds to step 60, whereat the second bit is erased (e.g., since the first bit is properly erased, the second must not have been), before the method 50 returns to step 52 where the erasure of both bits is re-verified. If, however, the first bit is not properly erased at step 58, the first bit is then erased at step 62, after which the method 50 returns to step 52. The method 50 thus provides selective erasure and verification of one or both bits in a dual bit memory cell, whereby proper erasure thereof is ensured. In this fashion, the cross-effects (e.g., over-erasure and/or data retention) between two bits in a dual bit memory cell may be accounted for and minimized, for example, by ensuring that the cell is not passed through erasure verification until both bits therein are properly erased.

Figure 4:
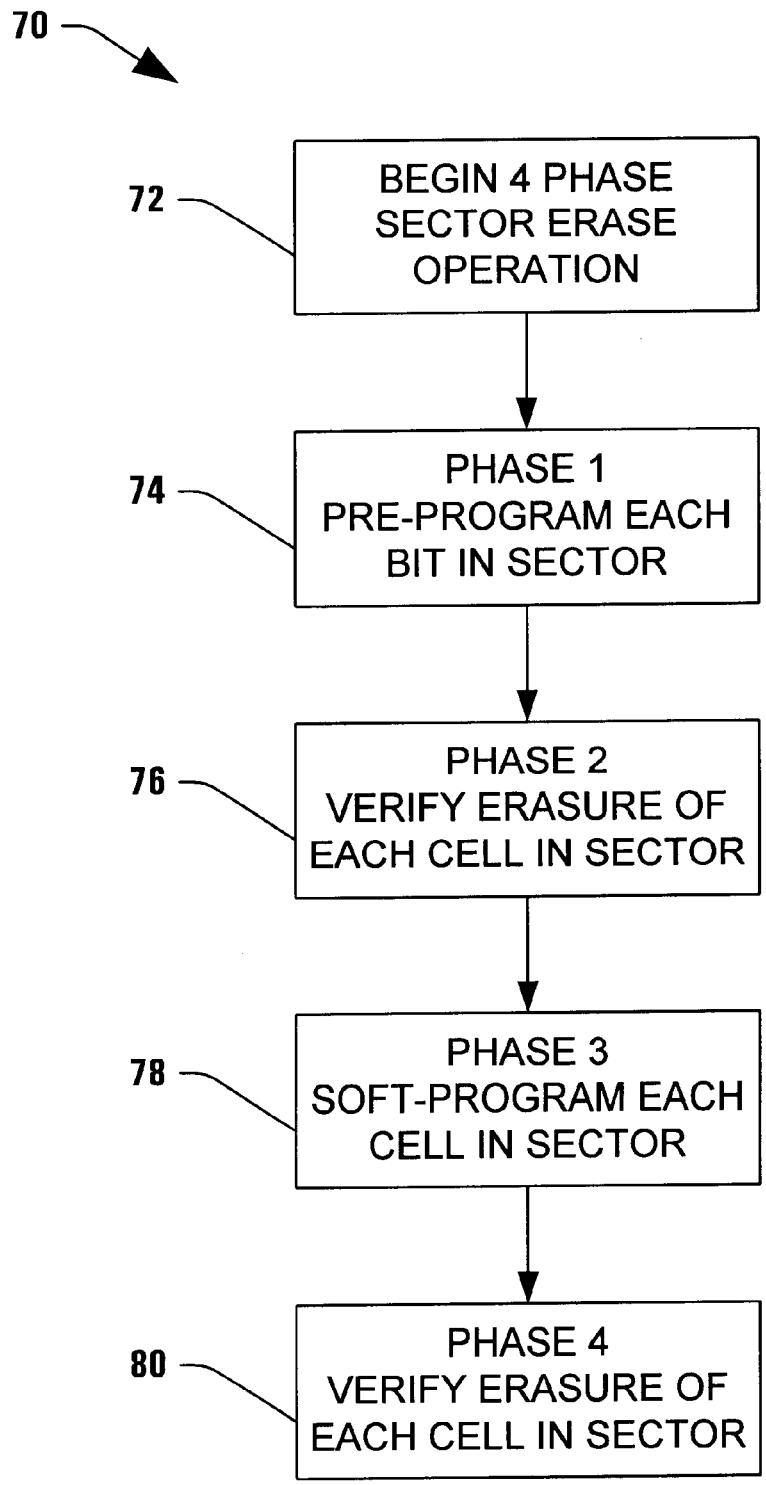
FIG. 4 is a flow diagram illustrating an exemplary four phase sector erase operation in which various aspects of the invention may be carried out.

Referring now to FIG. 4, an exemplary four phase sector or block erase operation 70 is illustrated beginning at step 72. In the first pre-programming phase at step 74, each bit of an array or memory sector is pre-programmed. At step 76, in the second phase, a first erase verify operation is performed to verify proper erasure of each cell in the memory sector. Thereafter, in the third phase at step 78, a soft-programming operation is performed in order to ensure against over-erasure of cells within the sector. In the fourth phase at step 80, a second erase verification is performed with respect to each cell in the memory sector, in order to ensure against possible deleterious effects of the application of soft programming pulses in the third phase at step 78.

Referring now to FIGS. 5A–5D, another exemplary method 100 of memory erasure is illustrated, which may be implemented as part of a multi-phase array or sector erasure operation (e.g., operation 70 of FIG. 4). The details of the method 100 will be described herein with respect to the erase phases thereof (e.g., phases 2 and/or 4 at steps 76 and 80 of operation 70 in FIG. 4), while the specifics of the pre-programming and soft-programming phases (e.g., steps 74 and 78 of operation 70) will be omitted for the sake of brevity.

The method 100 begins at step 102, after which a pulse counter is reset at step 104. The pulse counter is reset for each sector being erased, and is used in the exemplary method 100 to limit the number of times an erase pulse is applied to a cell, after which the cell may be treated as unusable (e.g., 6000). A do-sector flag DOSECT is tested at decision step 106, and if set (true), a latched sector of the memory device is erased and verified as described in greater detail hereinafter. Initially, any sectors which are to be erased may be latched, causing the DOSECT flag to be set. An any-erase flag AERS is tested at step 108, which is true if a chip erase or sector erase operation is to be performed, and false if a byte programming operation is to be performed. If AERS is false, the method 100 terminates at step 110.

If AERS is true, a sector address counter is incremented at step 112, which is then compared to a max sector address at decision step 114. The designated sectors to be erased are pre-programmed in the first phase of the method 100, the detailed discussion of which is omitted for the sake of brevity. Pre-programming proceeds through the various steps of method 100 as illustrated in FIGS. 5A–5D, after which the maximum sector address is reached at step 114. Pre-programming having thus been completed, method 100 continues at decision step 116, where a first_VERIFY flag is tested. The first_VERIFY flag is initially false (logic 0) during the preprogramming phase, and is set at step 118 upon completion thereof, after which the method 100 returns to step 102. Where the max sector address has not been reached at step 114, a second_VERIFY flag is set to 0 at step 119.

Once in the second phase (first_VERIFY=1), the pulse counter is again reset at step 104, and the DOSECT flag is tested at step 106. If true (erasure of at least one memory sector is to be verified), the method 100 proceeds to step 120 of FIG. 5C, whereat an erasure verification pulse or voltage is applied to a memory cell. The verification pulse is applied for a minimum time period via wait step 122, after which the proper erasure of the cell bit is tested at step 124. For example, the erasure of a bit may be tested by application of a voltage to a memory cell at steps 120 and 122, with a current being sensed at step 124, as described in greater detail hereinafter.

Figure 5A:
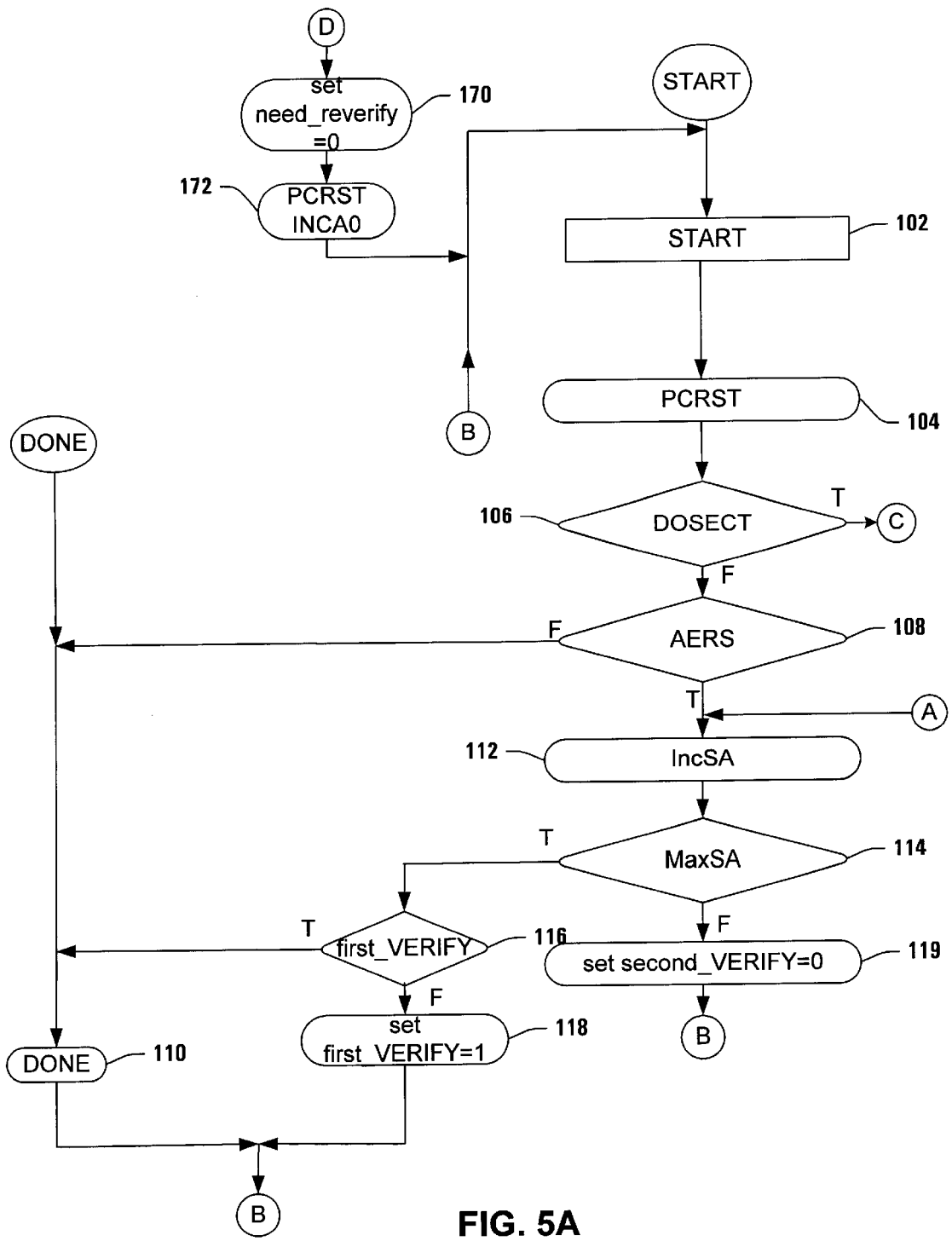
FIG. 5A is a flow diagram illustrating another exemplary method for verifying memory cell erasure in accordance with another aspect of the invention.

If MATCH is true at step 126 (the cell bit has been properly erased), AERS is tested at step 128, and if false (e.g., byte programming operation being performed), the method terminates at step 110 of FIG. 5A. If AERS is true (e.g., sector erase or chip erase enabled), the first_VERIFY flag is tested at step 130 (which is true for the first erase verify phase), and the method proceeds to step 132 of FIG. 5B. A SIDE_B flag is tested at step 132, which is initially false (logic 0), indicating that side "A" of a dual bit memory cell is being verified (e.g., bit A of cell 2 in FIG. 1). At this point, it will be recognized that where the first_VERIFY flag is false at decision step 130 of FIG. 5C (e.g., during pre-programming), the method does not proceed to step 132. Rather, the byte address is incremented and the pulse counter is reset at step 133, where after decision step 174 tests whether the maximum column address has been reached, as described in greater detail hereinafter.

Figure 5B:
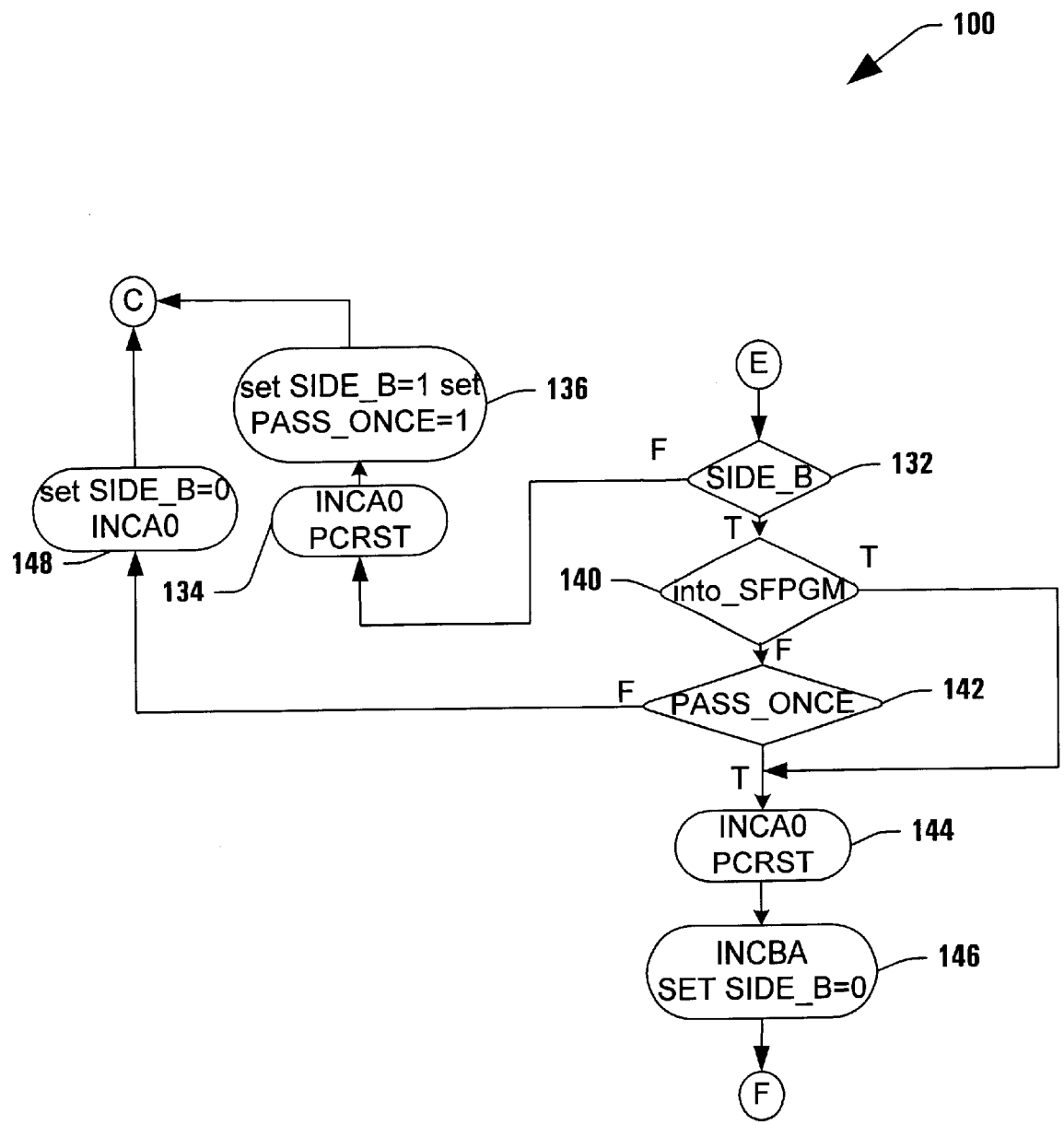
FIG. 5B is a flow diagram further illustrating the method of FIG. 5A.

Referring again to step 132 of FIG. 5B, where the SIDE_B flag is false, the method 100 proceeds to step 134 in FIG. 5B, whereat an INCA0 operation is performed (whereby a flag is incremented, which indicates whether side "A" or side "B" is being operated on), in order to change the verification to the "B" side of the dual bit cell. In addition, the pulse counter is reset at step 134, where after a flag SIDE_B is set to 1, and a flag PASS_ONCE is set to 1 at step 136. The PASS_ONCE flag is set to 1 when the "A" side of a cell has been verified as properly erased, and is reset to 0 whenever an erase pulse is applied to one of the "A" or "B" sides of the cell.

Figure 5C:
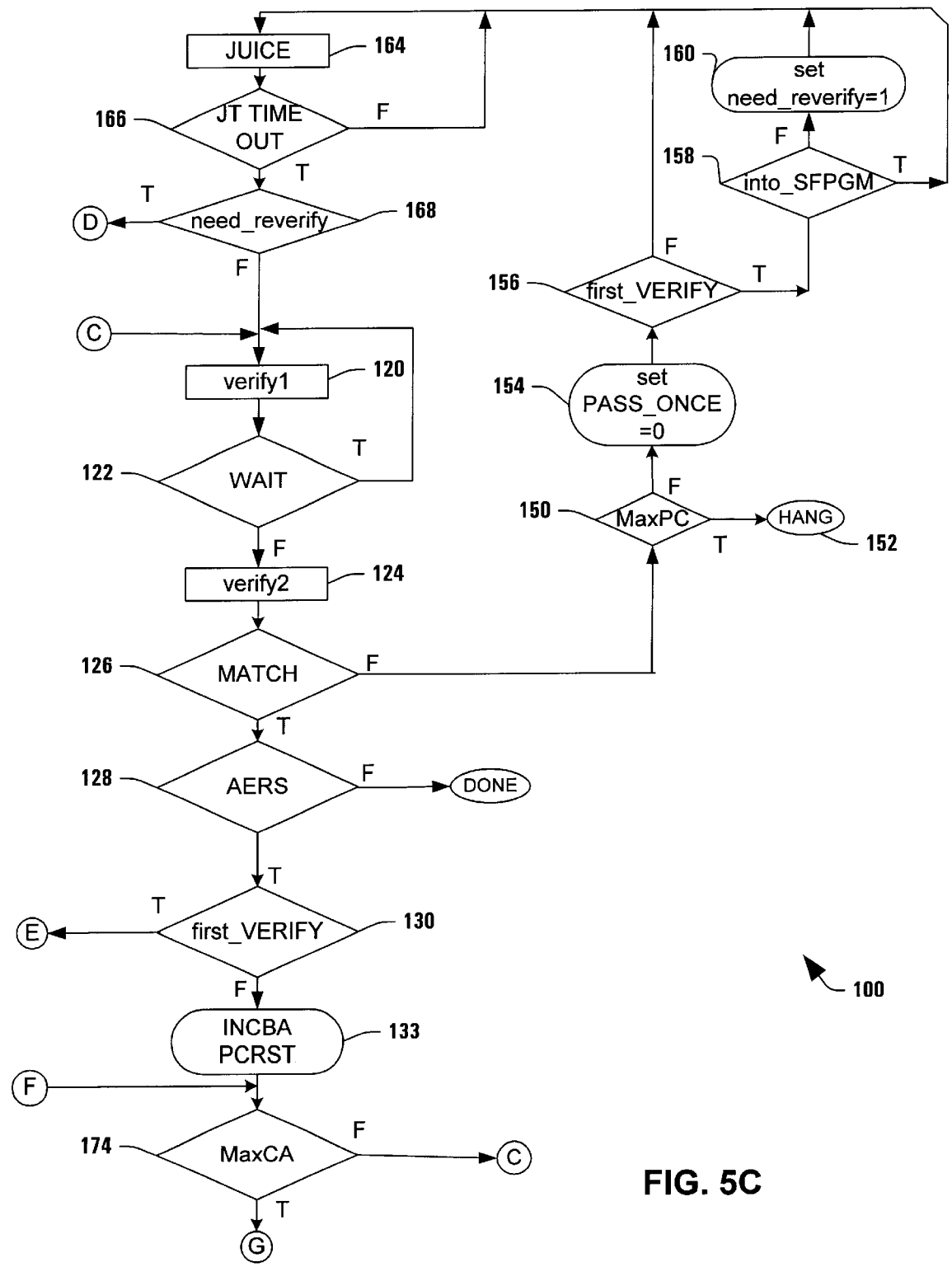
FIG. 5C is a flow diagram further illustrating the method of FIGS. 5A–5B.
Figure 5D:
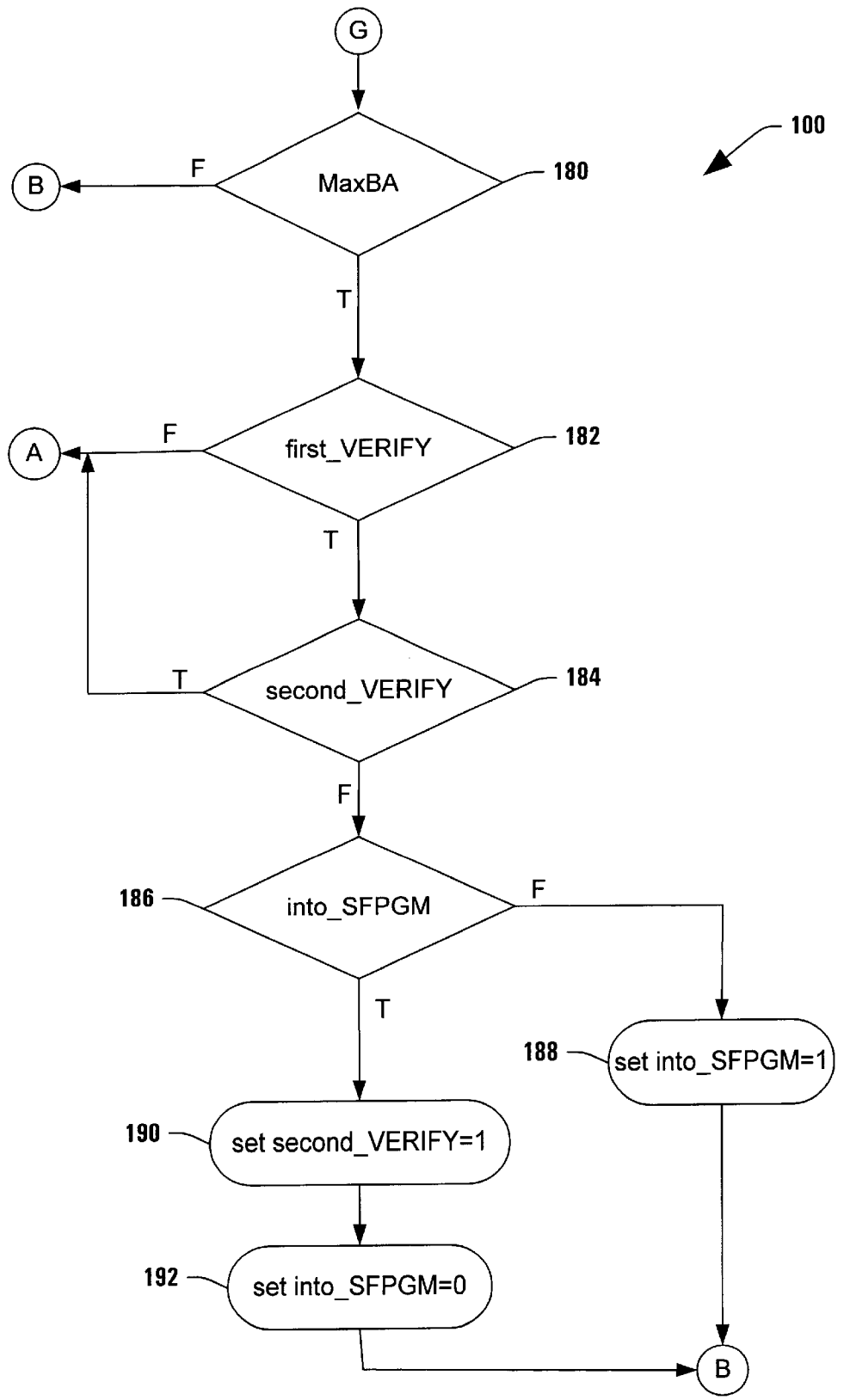
FIG. 5D is a flow diagram further illustrating the method of FIGS. 5A–5C.

Proceeding on to step 120 of FIG. 5C, the method 100 proceeds again through steps 120, 122, 124, and 126 as described above, with respect to the "B" side of the dual bit memory cell. If the "B" side is properly erased (MATCH =true at step 126), the method 100 proceeds back to step 132 of FIG. 5B via steps 128 and 130, whereat it is determined that the SIDE B_flag is true (logic 1 by virtue of being set previously at step 136). A flag into_SFPGM is tested at step 140 (used to indicate entry into the third soft-programming phase) and found to be false, whereby the PASS_ONCE flag is tested at step 142. This having been previously set at step 136, the method proceeds to step 144 where an INCA0 operation is performed (indicating that side "A" is now to be operated on), and the pulse counter is again reset.

Thus, where both the "A" and the "B" side bits of a dual bit memory cell are verified in succession to have been properly erased, the method 100 increments a byte address counter (INCBA operation) and sets a SIDE_B flag equal to 0 at step 146. In this manner, the erasure of a cell is deemed proper only when both bits of the cell are properly erased, thus accounting for the possibility that over erasure and/or data retention with respect to one bit in a dual bit cell may have a deleterious effect on operation of the other bit in the cell, and ensuring the proper erasure of both bits in sequence prior to proceeding to the next address. Where only the side "B" has been properly verified as erased, the flag PASS_ONCE will be false (logic 0) at decision step 142, after which the method 100 proceeds to step 148 whereat the flag SIDE_B is set to 0, and an INCA0 operation is performed, thus switching back to the other (e.g., "A") side of the dual bit memory cell.

Referring again to step 126 of FIG. 5C, where one side or bit of a dual bit memory cell fails the erasure verification at step 126, a MaxPC flag is tested at step 150 in order to determine whether the pulse counter has reached a maximum value. For example, where the method 100 applies erase pulses to a cell or a bit therein, a pulse counter is employed to ensure that the method applies only a certain number of such pulses (e.g., 6000) in attempting to re-erase a cell failing verification, before the cell is determined to be unuseable and the operation hangs (e.g., or otherwise indicates the existence of an unusable cell) at step 152. Assuming such a maximum has not been reached, the PASS_ONCE flag is set to 0 at step 154 and decision step 156 determines whether the first_VERIFY is true (method 100 is presently in the first verify phase, indicating that the pre-programming phase has been previously completed). If so, the into_SFPGM flag is tested at step 158. While in the first erase verify phase, this flag is false (logic 0), and the method 100 proceeds to step 160 whereat a need_reverify flag is set, indicating that a cell bit is to be re-verified.

Proceeding then to steps 164 and 166 of FIG. 5C, an erase pulse of a certain time duration is applied to the cell with respect to the cell side or bit, where after the need_reverify flag is tested at step 168. If false (e.g., indicating that the operation is in either the pre-programming or soft program phase), the method 100 returns to again to step 120 where appropriate pre-programming or soft programming verification is performed via steps 120, 122, 124, and 126, as described above. Otherwise (e.g., need_reverify is true), the method 100 proceeds to step 170 of FIG. 5A, whereat the need_reverify flag is reset to 0. Thereafter at step 172, the pulse counter is reset and an INCA0 operation is performed to focus on the other side of the memory cell. In this fashion, where one side of a cell fails erase verification (e.g., at steps 120–126), an erase pulse is applied thereto (e.g., at steps 164 and 166). Method 100 then proceeds back to step 102, and the process is repeated until both sides or bits of a cell are properly verified, or the maximum number of pulses is applied in an attempt to properly erase one or both of the bits, and the method hangs at step 152.

Returning to FIG. 5B, when the PASS_ONCE flag is true at step 142 (e.g., indicating that both the "A" and "B" side bits were successfully verified in succession), an INCA0 operation is performed at step 144 (e.g., to point back to the "A" side), and the pulse counter is reset, after which the byte address is incremented at step 146 and the SIDE_B flag is set to 0. Thereafter, method 100 proceeds at step 174 of FIG. 5C, where it is determined whether the maximum column address (e.g., the end of a word line) has been reached. If not, the remaining columns in the word are verified as described above. If so, decision step 180 of FIG. 5D determines whether the maximum byte address (e.g., the last byte of the current sector) has been completed. If not, the remaining bytes in the sector are verified as described above.

If all sector bytes have been verified in the second phase (e.g., the first erase verify phase), at step 182 (first_VERIFY flag is true), and the second_VERIFY flag is false at step 184, decision step 186 tests the into_SFPGM flag. At this point, the first erase verification phase is complete, and the method proceeds to set the into_SFPGM flag at step 188, whereby the soft programming phase is implemented, the detailed description of which is omitted for the sake of brevity. In this regard, it will be noted that the soft programming phase advantageously verifies and selectively adjusts the threshold voltage of the cell bits, to ensure against possible over-erasure thereof which may have been caused by the application of the erase pulses (e.g., at steps 164 and 166) during the first erase verification phase. In addition, it will be appreciated that during the pre-programming phase, the first_VERIFY flag is false, and thus, that decision step 130 of FIG. 5C accordingly transfers method 100 to step 133, rather than to step 132 of FIG. 5B, whereby the pre-programming phase does not include the alternation between cell sides or bits, as do the erasure verification phases. It will be further noted in this regard, that the first_VERIFY flag is set during the soft programming phase, whereby alternation between cell bits or sides is achieved.

Once the soft programming phase has been completed, the into_SFPGM flag is found to be true at decision step 186, whereby the second_VERIFY flag is set to 1 at step 190 (e.g., indicating that the second erase verification of operation phase 4 is to be performed next) and the into_SFPGM flag is reset to 0 at step 192 (e.g., indicating that soft programming has been completed). Thereafter, the method 100 again verifies proper erasure of the designated sector cells via the steps described above. It will be noted at this point, that the second verify pass (e.g., wherein the flag second_VERIFY is true) may be employed to ensure that any soft programming pulses applied during the soft programming phase have not inadvertently caused cell bits to fail the erase verification. In practice, the second erase verification phase proceeds with very few or no verification failures, selectively re-erasing certain bits as the need arises according to the verification steps 120–126.

Figure 6:
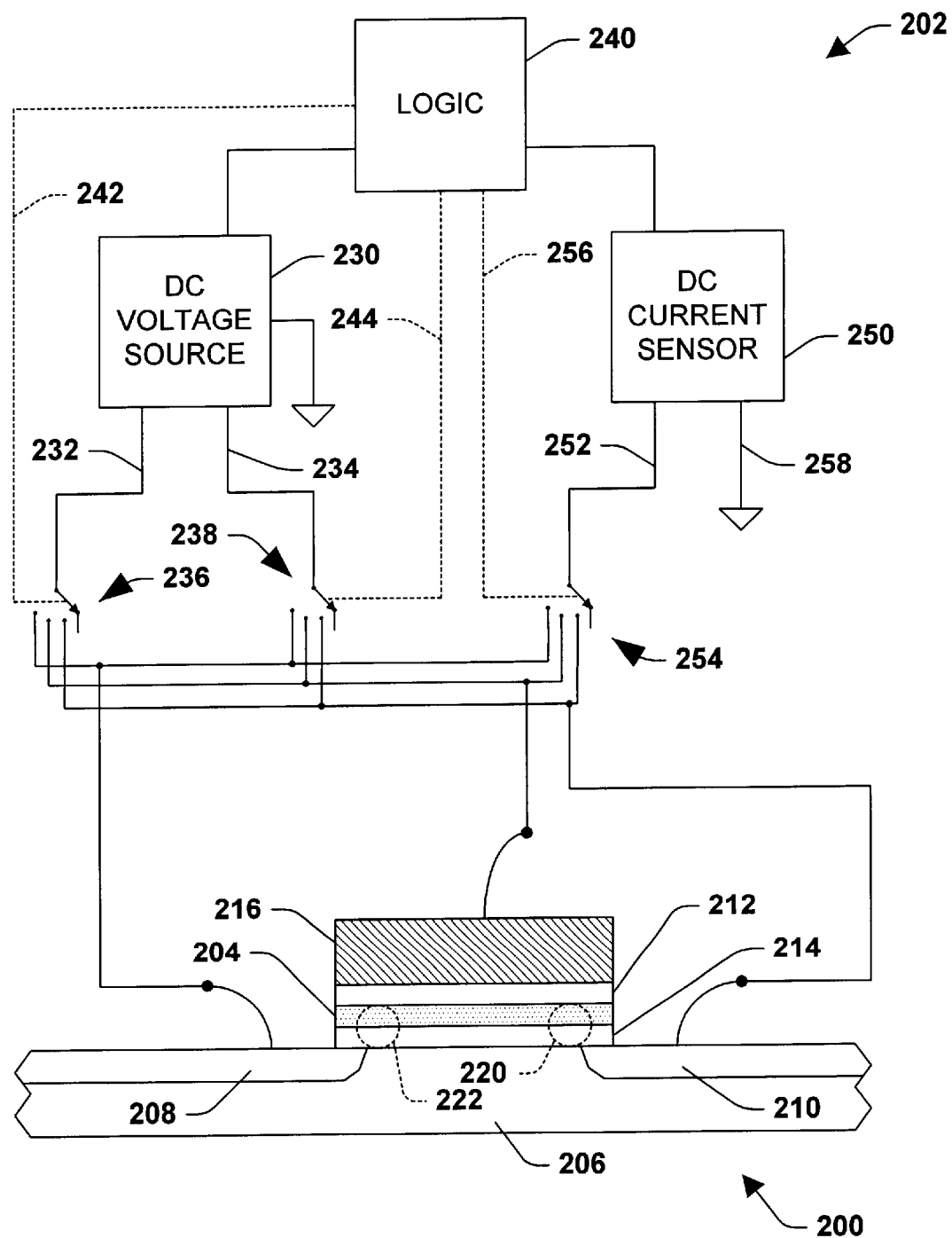
FIG. 6 is a schematic side elevation view in section of an exemplary dual bit memory cell and a system for verifying erasure thereof.

Referring now to FIG. 6, an exemplary dual bit memory cell 200 is illustrated in section, together with a system 202 for verifying erasure thereof, in accordance with another aspect of the invention. It will be recognized that the above described methods 22, 50, and/or 100 of FIGS. 2, 3, and 5A–5D, respectively, may be employed in conjunction with the exemplary system 202. In addition, those skilled in the art will appreciate that the foregoing methodologies may be implemented in association with many systems other than the system 202. The memory cell 200 comprises a silicon dioxide layer 204 with buried polysilicon islands (not numerically designated) therein. A P-type substrate 206 has buried N+ source 208 and N+ drain 210 regions. The silicon dioxide 204 is sandwiched between two layers of silicon dioxide 212, and 214. Alternatively, the layer 204 may comprise a silicon nitride or any other form of charge trapping layer.

Overlying the oxide layer 212 is a polysilicon gate 216. This gate 216 is doped with an N-type impurity (e.g., phosphorus). The memory cell 200 is capable of storing two data bits, a right bit represented by the dashed circle 220 and a left bit represented by the dashed circle 222. The dual bit memory cell 202 is generally symmetrical, thus the drain 210 and the source 208 are interchangeable. Thus, the left junction 208 may serve as the source terminal and the right junction 210 as the drain terminal with respect to the right bit 220. Likewise, the right junction 210 may serve as the source terminal and the left junction 208 as the drain terminal for the left bit 222.

The system 202 includes a DC voltage source 230 having a first terminal 232 and a second terminal 234, adapted to selectively apply a voltage across two of the source 208, the drain 210, and the gate 216 via switching devices 236 and 238 connected to the first and second terminals 232 and 234, respectively. Source 230, moreover, may selectively apply positive or negative voltages to one or both of the terminals 232 and 234. The switching devices 236 and 238 are controlled by a logic device 240 via control lines 242 and 244, respectively. The system 202 further comprises a DC current sensor 250 having a first terminal 252 connected to a switching device 254 providing selective connection of the terminal 252 with one of the source 208, the drain 210, and the gate 216. The logic device 240 controls the position of switching device 254 via a control line 256. Current sensor 250 further includes a second terminal 258 connected to a common or ground. The current sensor 250 may also include a sense amplifier circuit (not shown) which is "on-chip" with respect to the cells under test.

The logic device or circuit 240 is thus adapted to selectively provide for the application of voltages to the dual bit memory cell 200 via source 230 and switching devices 236 and 238, and to selectively measure or sense a current associated therewith using the sensor 250 and switching device 254, in order to selectively program, erase, read, and/or verify erasure of one or both bits 220 and 222 of the cell 200. The logic circuit 240 may also reside "on-chip" with respect to the memory cells under test. The cell 200, moreover, may be connected with other such cells (not shown) in a NOR type configuration (e.g., with the respective gates 216 thereof connected together by a common word line associated with a row of such cells). The system 202 may accordingly further include circuitry for individually applying voltages and/or measuring currents associated therewith (not shown).

In operation, individual flash cells (e.g., cell 200) may be individually addressed via the logic device 240 for programming (writing), reading or erasing functions. For example, bit 220 may be programmed by applying programming voltages to the gate 216 and drain 210 while the source 208 is grounded. Hot electrons are accelerated sufficiently to be injected into the circled region 220 of the trapping dielectric layer 204 near the drain 210. Bit 220 of cell 200 may be read in the opposite direction via application of voltages to the gate 216 and the source 208 while the drain 210 is grounded. Bit 222 may be programmed by applying programming voltages to the gate 216 and source 208 while the drain 210 is grounded. Hot electrons are thereby injected into the circled region 222 of the trapping dielectric layer 204 near the source 208. Bit 222 may be read in the opposite direction by applying voltages to the gate 216 and the drain 210 while the source 208 is grounded. Both bits 220 and 222 of cell 200 may be erased by applying erase voltages or pulses to the gate 216 and the drain 210 to erase bit 220, and to the gate 216 and the source 208 to erase bit 222, thereby causing electrons to be removed from the charge trapping region of the nitride layer 204. Electrons move from the nitride through the bottom oxide layer 214 to the drain 210 or the source 208 for bits 220 and 222, respectively.

To verify erasure of the memory cell bit 220, a predetermined voltage greater than the threshold voltage of an unprogrammed or erased cell bit, but less than the threshold voltage of a programmed bit, is applied to the gate 216 with a voltage applied between the source 208 and the drain 210. If the bit 220 conducts (e.g., as sensed by the sensor 250), then the bit 220 has been erased. Alternatively, if the cell bit 220 does not conduct (or only a small leakage current is measured by the sensor 250) then the bit 220 has not been properly erased. In order to erase the bit 220, an erase voltage pulse is applied to the gate 216 with the drain 210 floated, while the source 208 is held at a positive potential. The system 202 is thus adapted to selectively verify proper erasure of one or both of the bits 220 and 222 of the dual bit cell 200, and to selectively erase one or both of the bits 220 and 222 if an erase verification fails for one of these bits. For example, the logic device 250 may be adapted to verify proper erasure of the dual bit cell 200 by selectively verifying, re-verifying, and/or re-erasing one or both bits 220 and 222 thereof in accordance with the methods 22, 50, and/or 100 of FIGS. 2, 3, and 5A–5D, respectively.

Although the invention has been shown and described with respect to one or more implementations, equivalent alterations and modifications will occur to others skilled in the art upon the reading and understanding of this specification and the annexed drawings. In particular regard to the various functions performed by the above described components (assemblies, devices, circuits, etc.), the terms (including a reference to a "means") used to describe such components are intended to correspond, unless otherwise indicated, to any component which performs the specified function of the described component (i.e., that is functionally equivalent), even though not structurally equivalent to the disclosed structure which performs the function in the herein illustrated exemplary implementations of the invention. In addition, while a particular feature of the invention may have been disclosed with respect to only one of several implementations, such feature may be combined with one or more other features of the other implementations as may be desired and advantageous for any given or particular application. Furthermore, to the extent that the term "includes" is used in either the detailed description and the claims, such term is intended to be inclusive in a manner similar to the term "comprising."

What is claimed is:

1. A method of verifying erasure of a dual bit memory cell, comprising:
    performing a determination of whether a first bit in the dual bit memory cell is properly erased;
    performing a first verification of whether a second bit in the dual bit memory cell is properly erased if the first bit is properly erased; and
    determining that the dual bit memory cell is properly erased if the first bit is properly erased and if the second bit is properly erased according to the first verification.

2. The method of claim 1, further comprising repeating the method of verifying erasure for another dual bit memory cell.

3. The method of claim 1, wherein performing the determination of whether the first bit in the dual bit memory cell is properly erased comprises:
    applying a voltage signal to the cell;
    sensing a current in the cell; and
    determining whether the first bit is properly erased according to the sensed current.

4. The method of claim 1, wherein performing the first verification of whether the second bit in the dual bit memory cell is properly erased comprises:
    applying a voltage signal to the cell;
    sensing a current in the cell; and
    verifying whether the second bit is properly erased according to the sensed current.

5. The method of claim 1, further comprising:
    erasing the first bit if the first bit is not properly erased; and
    performing the first verification of whether the second bit is properly erased after erasing the first bit.

6. The method of claim 5, wherein performing the first verification of whether the second bit is properly erased comprises:
    applying a voltage signal to the cell;
    sensing a current in the cell; and
    verifying whether the second bit is properly erased according to the sensed current.

7. The method of claim 5, wherein erasing the first bit comprises applying a voltage to the cell.

8. The method of claim 5, further comprising:
    repeating the determination of whether the first bit in the dual bit memory cell is properly erased if the second bit is properly erased according to the first verification;
    repeating the first verification of whether the second bit in the dual bit memory cell is properly erased if the first bit is properly erased; and
    determining that the dual bit memory cell is properly erased if the first bit is properly erased and if the second bit is properly erased according to the repeated first verification.

9. The method of claim 5, further comprising:
    erasing the second bit if the second bit is not properly erased according to the first verification;
    repeating the determination of whether the first bit in the dual bit memory cell is properly erased;
    repeating the first verification of whether the second bit in the dual bit memory cell is properly erased if the first bit is properly erased; and
    determining that the dual bit memory cell is properly erased if the first bit is properly erased and if the second bit is properly erased according to the first verification.

10. The method of claim 9, wherein erasing the second bit comprises applying a voltage to the cell.

11. The method of claim 9, further comprising:
    erasing the second bit again if the second bit is not properly erased according to the repeated first verification;
    again repeating the determination of whether the first bit in the dual bit memory cell is properly erased;
    again repeating the first verification of whether the second bit in the dual bit memory cell is properly erased if the first bit is properly erased; and
    determining that the dual bit memory cell is properly erased if the first bit is properly erased and if the second bit is properly erased according to the repeated first verification.

12. The method of claim 11, further comprising repeating the method for another dual bit memory cell.

13. The method of claim 1, further comprising:
    erasing the second bit if the second bit is not properly erased according to the first verification;
    repeating the determination of whether the first bit in the dual bit memory cell is properly erased;
    repeating the first verification of whether the second bit in the dual bit memory cell is properly erased if the first bit is properly erased; and
    determining that the dual bit memory cell is properly erased if the first bit is properly erased and if the second bit is properly erased according to the repeated first verification.

14. The method of claim 13, further comprising:
    erasing the first bit if the first bit is not properly erased;
    performing a second verification of whether the second bit is properly erased after erasing the first bit; and
    repeating the determination of whether the first bit in the dual bit memory cell is properly erased if the second bit is properly erased according to the second verification;

repeating the first verification of whether the second bit in the dual bit memory cell is properly erased if the first bit is properly erased; and determining that the dual bit memory cell is properly erased if the first bit is properly erased and if the second bit is properly erased according to the repeated first verification.

15. The method of claim 14, further comprising repeating the method for another dual bit memory cell.

16. A method for erasing a plurality of dual bit flash memory cells, comprising:

erasing the plurality of dual bit flash memory cells;

verifying proper erasure of a first bit in at least one of the plurality of dual bit flash memory cells;

verifying proper erasure of a second bit in the at least one of the plurality of dual bit flash memory cells; and determining that the at least one of the plurality of dual bit memory cells is properly erased if the first bit is properly erased and if the second bit is properly erased.

17. The method of claim 16, further comprising selectively erasing at least one of the first and second bits if a respective one of the first and second bits is not properly erased.

18. The method of claim 17, further comprising selectively reverifying proper erasure of at least the one of the first and second bits.

19. The method of claim 17, further comprising:

erasing the first bit if the first bit is not properly erased;

reverifying proper erasure of the second bit after erasing the first bit;

reverifying proper erasure of the first bit after reverifying proper erasure of the second bit if the second bit is properly erased;

again reverifying proper erasure of the second bit after reverifying proper erasure of the first bit if the first bit is properly erased; and determining that the at least one of the plurality of dual bit memory cells is properly erased if the first bit is properly erased and if the second bit is properly erased.

20. A method of verifying erasure of a dual bit memory cell, comprising:

selectively verifying proper erasure of one of a first bit of the cell and a second bit of the cell;

determining that the dual bit memory cell is properly erased if the first and second bits of the cell are properly erased; and selectively erasing at least one of the first and second bits of the cell if the respective one of the first and second bits is not properly erased.

21. The method of claim 20, further comprising selectively reverifying proper erasure of one of the first and second bits after selectively erasing at least one of the first and second bits.

22. A system for verifying proper erasure of a dual bit memory cell, comprising:

means for selectively verifying proper erasure of one of a first bit of the cell and a second bit of the cell;

means for determining that the dual bit memory cell is properly erased if the first and second bits of the cell are properly erased; and means for selectively erasing at least one of the first and second bits of the cell if one of the first and second bits is not properly erased.

23. The system of claim 22, wherein the means for selectively verifying proper erasure includes a voltage source adapted to selectively apply a voltage across at least two terminals of the dual bit memory cell, and a current sensor adapted to selectively sense a current associated with the cell.

* * * * *

UNITED STATES PATENT AND TRADEMARK OFFICE
CERTIFICATE OF CORRECTION

PATENT NO. : 6,331,951 B1
DATED : December 18, 2001
INVENTOR(S) : Edward B. Bautista, Jr., Darlene G. Hamilton, Weng Fook Lee, Pau-Ling Chen, Keith H. Wong It is certified that error appears in the above-identified patent and that said Letters Patent is hereby corrected as shown below:

<u>Column 1,</u>
Line 19, please replace the word "lace" with the word -- place --.

Signed and Sealed this

Seventh Day of May, 2002

Attest:

JAMES E. ROGAN
*Attesting Officer*    *Director of the United States Patent and Trademark Office*